United States Patent
Tsironis

(10) Patent No.: US 9,366,710 B1
(45) Date of Patent: Jun. 14, 2016

(54) NOISE PARAMETER EXTRACTION METHOD

(71) Applicant: Christos Tsironis, Kirkland (CA)

(72) Inventor: Christos Tsironis, Kirkland (CA)

( * ) Notice: Subject to any disclaimer, the term of this patent is extended or adjusted under 35 U.S.C. 154(b) by 111 days.

(21) Appl. No.: 14/244,439

(22) Filed: Apr. 3, 2014

(51) Int. Cl.
*G01R 27/06* (2006.01)
*G01R 29/26* (2006.01)
*G01R 27/02* (2006.01)

(52) U.S. Cl.
CPC ............... *G01R 29/26* (2013.01); *G01R 27/02* (2013.01)

(58) Field of Classification Search
CPC ........ G01R 29/26; G01R 27/02; G01R 27/32; G01R 27/28; G01R 29/0814; G01R 31/31937; G01R 23/20; G01R 1/06772; G01R 23/16; G01R 23/02; H04B 3/462; H04L 1/20; G01V 1/364; G06K 9/624
See application file for complete search history.

(56) References Cited

U.S. PATENT DOCUMENTS

| | | | | |
|---|---|---|---|---|
| 4,491,783 A * | 1/1985 | Sawayama | ............ | G01R 29/26 324/614 |
| 4,998,071 A * | 3/1991 | Strid | ............ | G01R 29/26 324/612 |
| 6,850,076 B2 * | 2/2005 | Tsironis | ............ | G01R 27/32 324/637 |
| 6,877,043 B2 * | 4/2005 | Mallory | ............ | H04L 1/0003 709/251 |
| 7,053,628 B1 * | 5/2006 | Tsironis | ............ | G01R 31/2841 324/637 |
| 8,786,293 B1 * | 7/2014 | Tsironis | ............ | G01R 27/06 324/613 |
| 8,892,380 B2 * | 11/2014 | Simpson | ............ | G01R 27/02 324/537 |
| 2006/0279275 A1 * | 12/2006 | Simpson | ............ | G01R 27/28 324/750.16 |
| 2010/0030504 A1 | 2/2010 | Simpson | | |

* cited by examiner

*Primary Examiner* — Michael Zarroli

(57) ABSTRACT

A wideband four noise parameter extraction method uses randomly distributed source states; the data are collected using wideband electro-mechanical tuners and noise and small signal receivers (network analyzers) in fast frequency sweeps; because of the random nature of source impedances reliable noise parameter values are extracted using selected source admittance states, distinctly regrouped in a cluster around the reflection factor associated with the optimum noise figure Fmin and a cluster located anti-diametric to it for determining the equivalent noise resistance Rn. Multiple noise parameter extractions for all possible cross-combinations of source impedance states in each cluster at each measured frequency allows reliable and physically meaningful generation of wideband noise parameters, even for very low noise and potentially unstable DUT's.

4 Claims, 6 Drawing Sheets

FIGURE 1: prior art

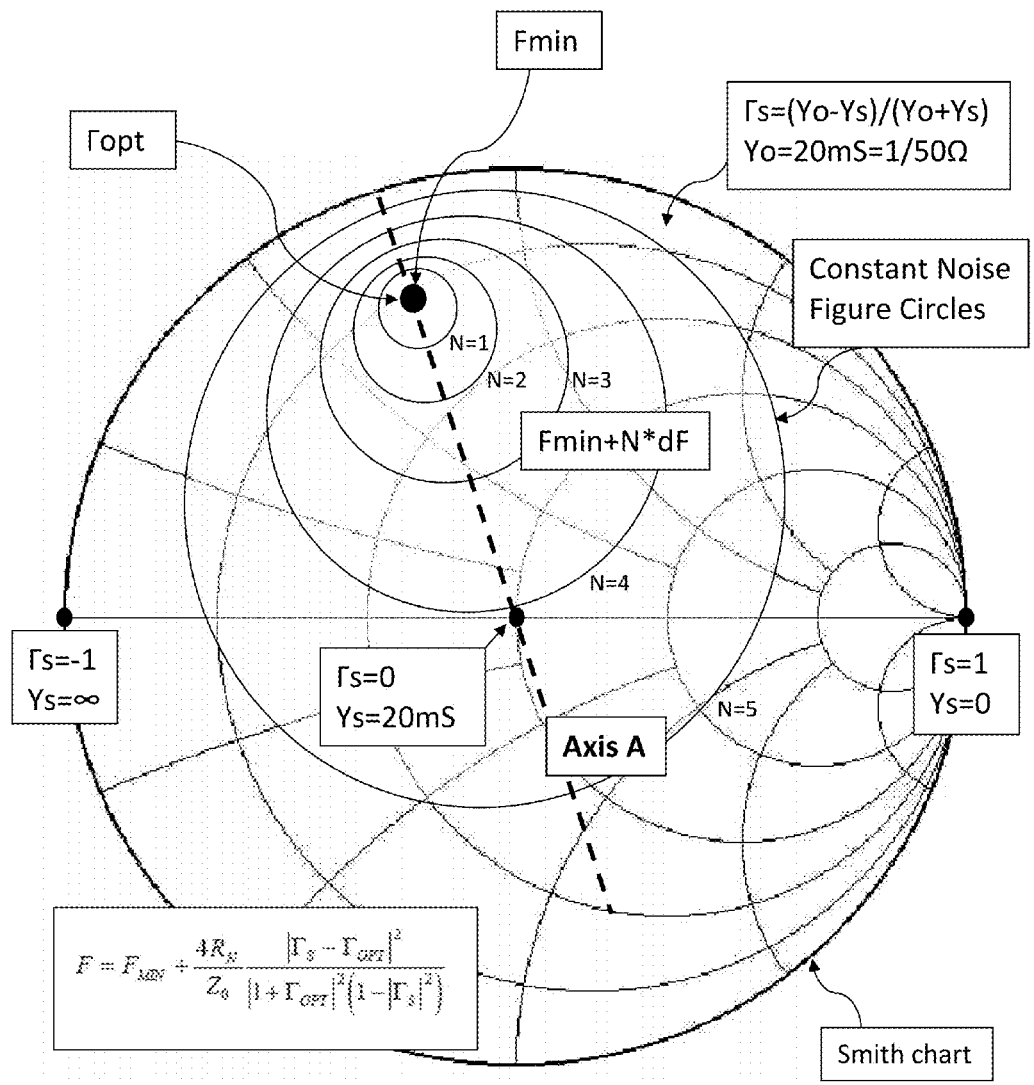
FIGURE 5; prior art

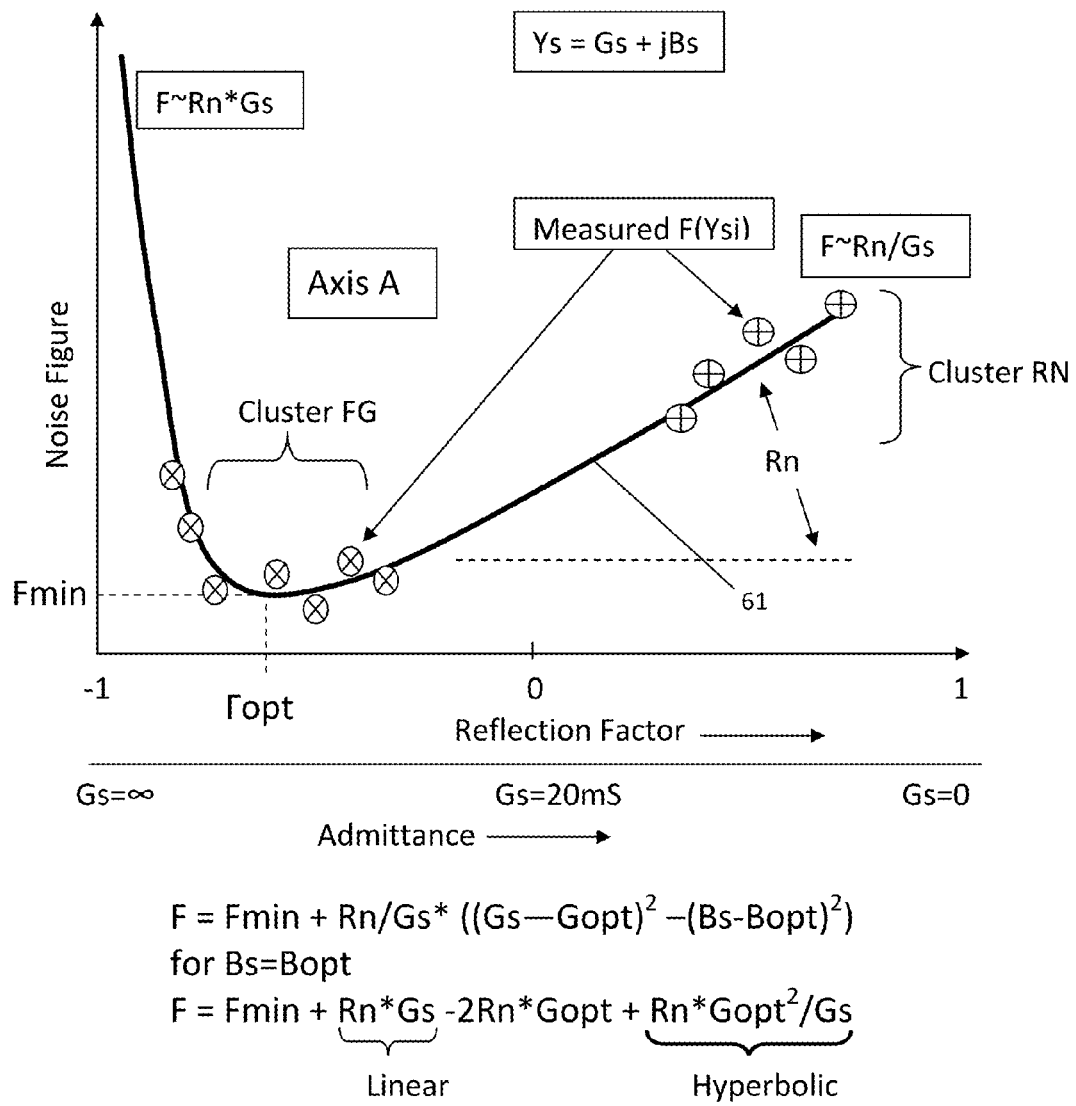
FIGURE 6: partly prior art

NOISE PARAMETER EXTRACTION METHOD

PRIORITY CLAIM

Not Applicable

CROSS-REFERENCE TO RELATED ARTICLES

1. H. ROTHE and W. DAHLKE, "Theory of noisy four poles", Proceedings of the IRE, June 1956, pages 811-818.
2. "Friis formulas for noise", http://en.wikipedia.org/wiki/Friis_formulas_for_noise
3. SISCHKA, Franz, "Basics of S-parameters, part 1", Characterization handbook, March 2002.
4. TSIRONIS. C. "Noise Parameter Measurement System and Method", U.S. patent application Ser. No. 13/198,966, August 2011.
5. SIMPSON, G. "Data measurement methods and systems", US Provisional patent application US 2010/0030504A1.
6. M. SANNINO, "On the determination of Device Noise and Gain Parameters", Proceedings IEEE, vol. 67, pages 1364-1382, September 1979.
7. R. LANE, "The determination of Device Noise Parameters", Proceedings IEEE, vol. 57, pages 1461-1462, August 1969.
8. Patent DE 41 22 189 (1268-P).
9. "Noise Figure Measurement Accuracy—The Y-Factor Method", Agilent Application Note 57-2, http://cp.literature.agilent.com/litweb/pdf/5952-3706E.pdf.
10. "About Adapter Removal Calibration Technique", Agilent, http://ena.tm.agilent.com/e5071c/manuals/webhelp/eng/measurement/calibration/advanced_calibrations/adapter_removal.htm#About_Adapter_Removal.
11. "Stability Circles: Input/Output Plane Stability Circles (SB1, SB2)", Agilent, http://cp.literature.agilent.com/litweb/pdf/genesys200801.
12. "Singular Value Decomposition", Wikipedia, http://en.wikipedia.org/wiki/Singular_value_decomposition.

STATEMENT REGARDING FEDERALLY SPONSORED RESEARCH OR DEVELOPMENT

Not Applicable

REFERENCE TO SEQUENCE LISTING, A TABLE, OR A COMPUTER PROGRAM LISTING COMPACT DISC APPENDIX

Not Applicable

BACKGROUND OF THE INVENTION AND PRIOR ART

This invention relates to testing and characterization of low noise microwave and RF transistors and amplifiers (device under test, DUT); the method disclosed comprises a noise measurement data processing method for extracting the "four noise parameters" of the DUT the noise data having been acquired using a prior art test setup. The typical test setup is shown in FIG. 1; it uses remotely controlled wideband microwave impedance/admittance tuners in order to synthesize source reflection factors Γs (or admittances Ys) at the input of said DUT and allow collecting the necessary noise power data using appropriate high sensitivity receivers. A main difficulty associated with such measurements is the extremely low level of the quantities to be measured: the basic noise available is thermal noise, which amounts to a spectral density of $-174$ dBm/Hz (or approximately $2*10^{-18}$ Watt/Hz) or a receiver with a 1 MHz bandwidth would have to detect reliably a power of $2*10^{-12}$ Watt=2 pico-Watt. It is obvious that these orders of magnitude are difficult to handle and any such power reading will be associated with unavoidable fluctuations.

All RF two-ports containing semiconductor devices (DUT) contain internal noise sources which affect the purity of the signal entering at the input port and existing (amplified) at the output port. A common way of characterizing the "purity" of said DUT at each frequency and bias conditions is the "noise figure: F". The noise figure is defined as the degradation of the signal purity or "signal to noise ratio" change between the input and output ports of the DUT:

$$F=(S.\text{in}/N.\text{in})/(S.\text{out}/N.\text{out}) \qquad (\text{eq. 1}).$$

Since the DUT adds to the transmitted signal its internal noise, the S/N ratio at the input is higher than at the output, therefore F>1.

It has been established (see ref. 1) that four real numbers fully describe the noise behavior of any noisy (passive or active) two-port; these are the four noise parameters. By generally accepted convention the four noise parameters (4NP) are: Minimum Noise Figure (Fmin), Equivalent Noise Resistance (Rn) and Optimum Noise Admittance (Yopt=Gopt+j*Bopt) (see ref. 4) or reflection factor Γopt=|Γopt|exp(jφopt). The noise behavior of a two-port only depends on the admittance of the source and not of the load. The general relationship is:

$$F(Ys)=F\text{min}+Rn/Re(Ys)*|Ys-Yopt|^2 \qquad (\text{eq. 2}),$$

whereby $Ys=Re(Ys)+jIm(Ys)=Gs+jBs$.

F(Ys) in eq. (2) being the noise figure of the chain including the DUT and the receiver, the relationship introduced by FRIIS (see ref. 2) is used to extract the noise figure of the DUT itself: FRIIS' formula is: $F.\text{dut}=F.\text{total}-(F.\text{rec}-1)/G\text{av.dut}$ (eq. 2); hereby F.dut is the noise figure of the DUT, F.total is the noise figure of the chain DUT and receiver, F.rec is the noise figure of the receiver and Gav.dut is the available Gain of the DUT for the given frequency and bias conditions. F.rec and Gav.dut depend both, on the S-parameters of the DUT and the source admittance Ys (eq. 2) and reference 3.

The basic, prior art, test setup is shown in FIG. 1: It comprises a calibrated noise source (1), an impedance tuner (2), a test fixture (3) to hold the DUT and a sensitive noise receiver (4). The tuner (2) and the noise receiver (4) are controlled by a system computer (5), which sets the source admittance Ys (6), created by the tuner, and retrieves digitally the associated noise measurement data from the noise receiver (4). After termination of the measurement session the computer program processes the measured data and extracts the four noise parameters of the DUT for a given frequency and DUT bias conditions. At least 4 values for Ys are required to extract the 4 noise parameters, but in general there have been used between 7 and 11 Ys values, in order to cancel out and compensate for random fluctuations and measurement errors.

From eq. 2 it follows that, in order to determine the four noise parameters, one would have to take four measurements at four different source admittance values Ys. However, noise measurements are extremely sensitive and various disturbances cause measurement errors and uncertainties. It is therefore the accepted procedure to acquire more than four data points, at each frequency and extract the noise parameters using a linearization and error minimization technique (see ref. 2). This method has been used and refined for many years (see ref. 5 and 6) but is in general cumbersome and prone to insufficiencies, since the DUT may oscillate (see ref. 11) or the impedance tuner may create tuning repeatability and thus measurement errors, which are difficult to identify and eliminate if there are not enough data points to extract from. The conclusion is that, to improve the reliability of the measurement one needs more data and elaborated extraction algorithms in order to deal with the noise parameter extraction problem as a statistical observation event. Typically 7 or more source admittance (reflection factor) points are used.

Tsironis (see ref. 4), discloses a measurement algorithm, which superimposes a tuning loop over a DUT "parameter" control loop; "parameter" being either frequency or DC bias of the DUT. This is done in order to increase the measurement speed, at the risk of measurement accuracy. In this case the measurement speed can be significantly higher, because changing frequency or DC bias is an electronic operation and much faster than changing (mechanical) tuner states. For each frequency the same tuner state (created by positioning a probe/slug) corresponds to different source admittance and for each other DC bias point the optimum area of source admittance is different, since the physical behavior of the DUT changes with DC bias. Tsironis does not disclose a method for using impedance states adapted to the Noise Parameter searched. He only considers numerical and physical stability and physical obviousness criteria to use or eliminate tuner states in his calculations.

This invention discloses a Noise Parameter Extraction method, which uses targeted tuner states for each parameter to be extracted, i.e. another set of tuner states is used to calculate Fmin than is used to calculate Rn. The method yields reliable data because the search among randomly erroneous observation data does allow this. The method is legitimate and is used often in optimization techniques where each element of a searched model is differently sensitive to the measured data.

DESCRIPTION OF THE DRAWINGS

FIG. 5 depicts prior art: constant noise figure circles on a source reflection factor Smith chart.

FIG. 6 depicts tuner states selection in Fmin/Fopt (FG) cluster and Rn (RN) cluster regions.

DETAILED DESCRIPTION OF THE INVENTION

FIG. 5 shows the typical dependence of Noise Figure "F" from the source admittance (reflection factor). Equation (1) describes a set of isometric circles on the Smith chart. The center of the smallest circle is the optimum admittance Yopt (or the equivalent Topt) following the relation: $\Gamma opt=(Yo-Yopt)/(Yopt+Yo)$, whereby Yo is the normalization admittance corresponding to the normalization impedance $Zo=50\Omega (Yo=20 \text{ mS})$. The radius of the isometric noise figure circles increases and their center shifts towards the periphery of the Smith chart as the parameter F increases. A dependence of noise figure across the circles (section Axis A) is shown in FIG. 6. It shows a hyperbolic increase towards the closer edge of the Smith chart ($F \sim 1/Gs$) whereby $Gs=Re(Ys)$ and, approximately, a linear increase towards the far edge of the Smith chart: $F \sim Rn*Gs$.

In an analytic formulation the relation between noise figure and source admittance is shown in the following equations:

$$F=Fmin+Rn/Gs*((Gs-Gopt)^2-(Bs-Bopt)^2) \qquad (eq.3)$$

for $Bs=Bopt$ $$F=Fmin+Rn*Gs-2Rn*Gopt+Rn*Gopt^2/Gs \qquad (eq.4)$$

equation 4 makes obvious that the dependence of the noise figure from the real part of Ys (Gs) is linear for large Gs and hyperbolic for small Gs. Assuming Gopt and Fmin have been determined before, the linear term "Rn*Gs" provides the lowest sensitivity of noise figure to Gs errors:

$$\partial F/\partial Gs \approx Rn-Rn*Gopt^2/Gs^2 \qquad (eq.5)$$

Equation 5 shows the sensitivity of the noise figure on errors in the real part of the source admittance Ys; hereby the second term is sensitive to Gs variations and the first term is independent of it. This obviously justifies data collection for points far from the Fmin/Yopt area (i.e. inside the cluster RN, see FIGS. 4 and 6) for highest accuracy determination of Rn.

Figure 1:
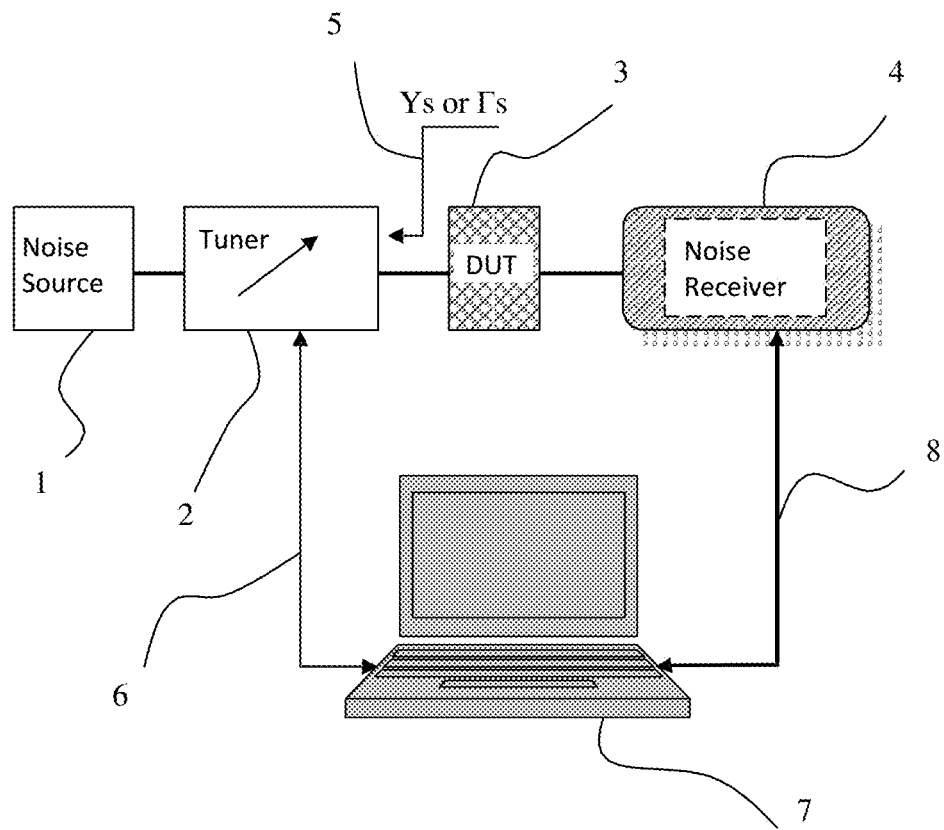
FIG. 1 depicts prior art, the basic configuration of noise parameter measurement system.
Figure 2:
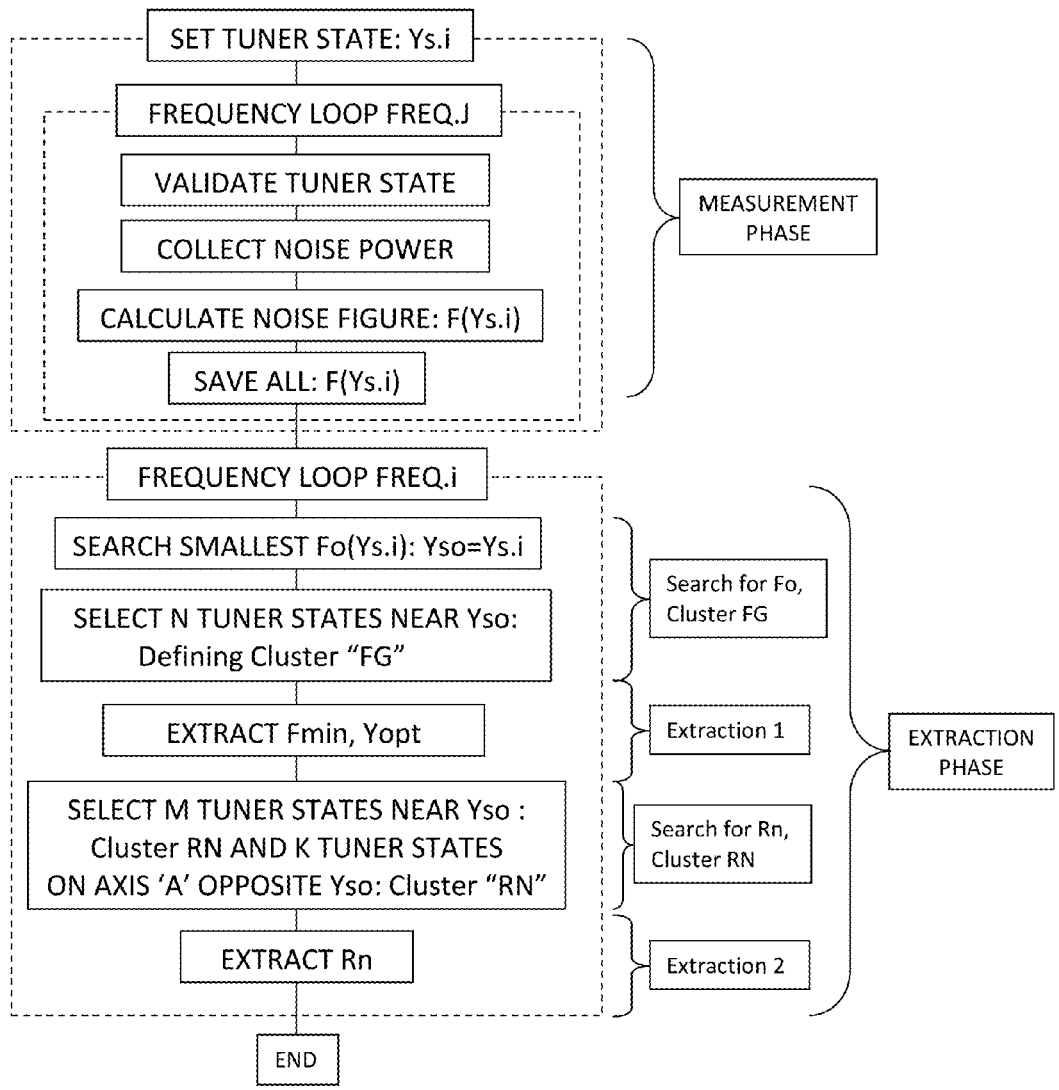
FIG. 2 depicts the flow-chart of the targeted noise parameter measurement and extraction method.

The cluster of measured tuner states in area FG contain mostly information about the level of Fmin and the location (amplitude and phase) of the optimum reflection factor (Topt). However those states contain insufficient information determining the behavior of the F curve leading away from the optimum point with a slope of Rn. Such information requires data on both ends of the curve with the Rn slope; i.e. points inside the cluster FG as well points far away from the optimum (i.e. inside the cluster of points marked with RN) as shown in FIG. 6. Therefore the strategy is to extract the four noise parameters in two steps as shown in the flowchart of FIG. 2.

The noise parameter determination is divided in two major steps: in the first step noise figure data of the DUT are collected using previously disclosed methods (see ref. 4). This step is marked as "Measurement Phase" in FIG. 2. After this step all the measured data are temporarily saved for all frequencies and randomly selected source admittance points. In a second major step the data are retrieved from temporary memory and processed. This process is the core of the present invention. It comprises two search steps and two extraction algorithms. The search occurs for each frequency individually: the smallest measured noise figure (Fo) of each set of data at the specific frequency is selected and the associated reflection factor Γs.o or admittance (Ys.o) identified. This corresponds to a reflection factor $\Gamma s.o=|\Gamma s.o|*exp(j\phi s.o)=(Yo-Ys.o)/(Ys.o+Yo)$, whereby Yo=20 mS; subsequently a number of typically 10 to 15 reflection factor states are identified among the measured data in the immediate neighborhood of Γo as marked in FIG. 4 as cluster "FG". Using these data the linearizing extraction method (see ref. 7) and extraction method for the four noise parameters of the DUT using Singular Value Decomposition methods (see ref. 12) are used to determine the four noise parameters.

These include the minimum noise figure Fmin and the optimum reflection factor Γopt or Yopt including its amplitude |Γopt| and phase φopt or real and imaginary part: Yopt=Gopt+jBopt. Since all admittance states used in this extraction are close and surrounding the smallest measured value Fo there exist high confidence for the extracted values Fmin and Yopt (or Γopt). All four noise parameters, Fmin, Rn, Yopt=Gopt+jBopt, are calculated, but it is assumed, due to the hitherto analysis and experiments (FIG. 3) that measured values F(Γs.i) placed in cluster FG will yield Fmin and Γopt with higher accuracy and consistency than Rn; the value of Rn is in certain doubt.

The set (cluster) of source reflection factors surrounding the said reflection factor Γs.o=|Γs.o|*exp(jφs.o) associated with said smallest measured noise figure Fo is chosen such that said reflection factors comprise values with amplitudes |Γs.i| both smaller and larger than |Γs.o| and phases on both sides of φs.o (φs.i is both smaller and larger than φs.o), whereby the radius of said cluster is approximately 0.1 reflection factor units around Γs.o.

Figure 4:
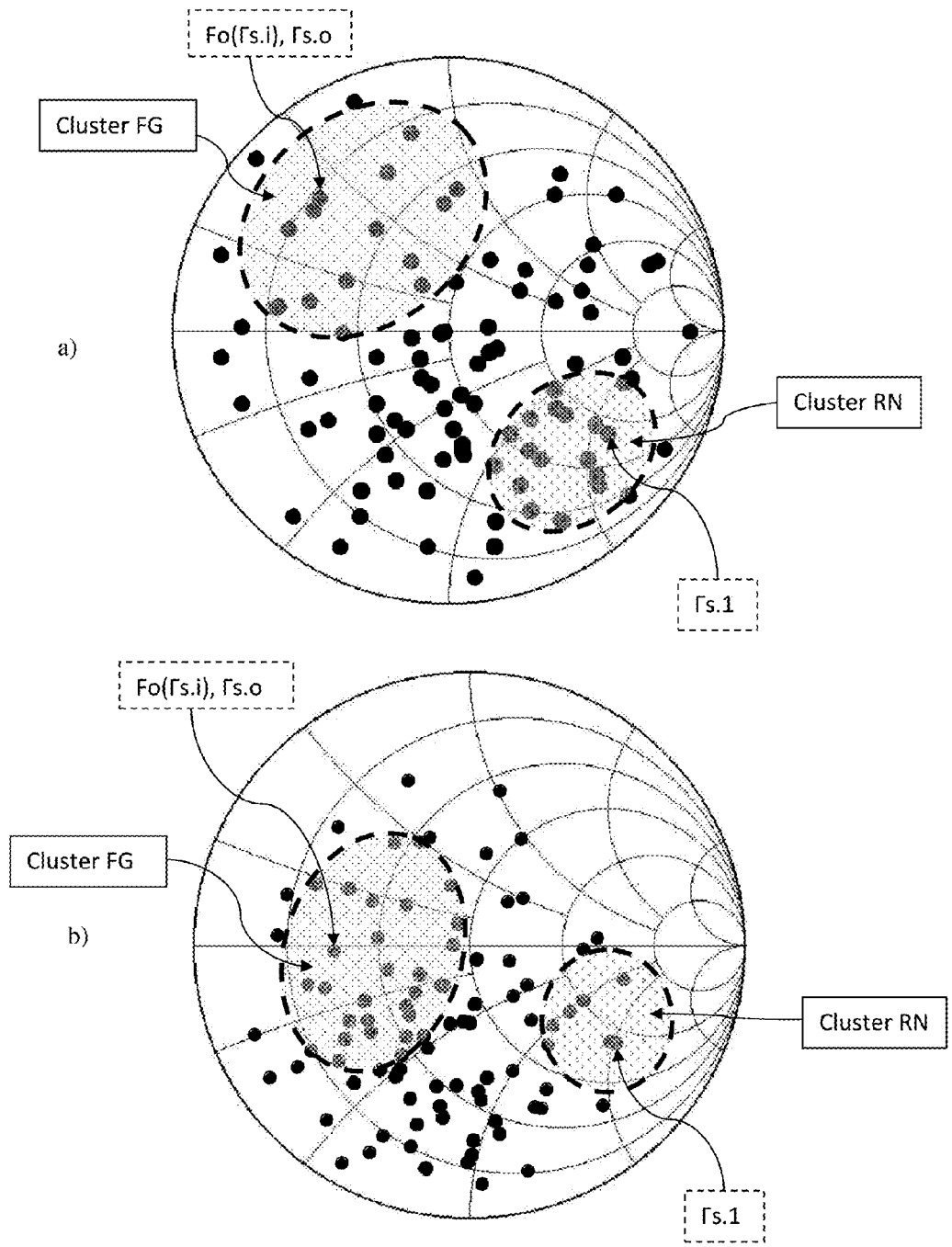
FIG. 4 depicts random distribution of tuner states at low (a) and high (b) frequencies.

In a next step (and for the same frequency always) a set of source states on the opposite side of the Smith chart (cluster "RN") in FIG. 4 is pinpointed. Again a number of 7 to 15 states in cluster RN are used and combined with the states of cluster FG to a new round of linearizing extractions. The result of this second round of extractions yields a more reliable value for Rn, because the data contain enough information about the slope of the curve (61). It must be noticed that the Fmin and Yopt values extracted in this second step are ignored. Attention is paid only to the value of Rn.

The cluster FG is chosen to have (typically) a larger radius than the cluster RN and include more tuner states. This is because the data in cluster FG are used to determine both Fmin and the amplitude, and in particular the phase of Γopt, whereby the data in cluster RN are mostly used to determine the slope of curve (61) without any additional information needed for the phase of Γs.1.

Figure 3:
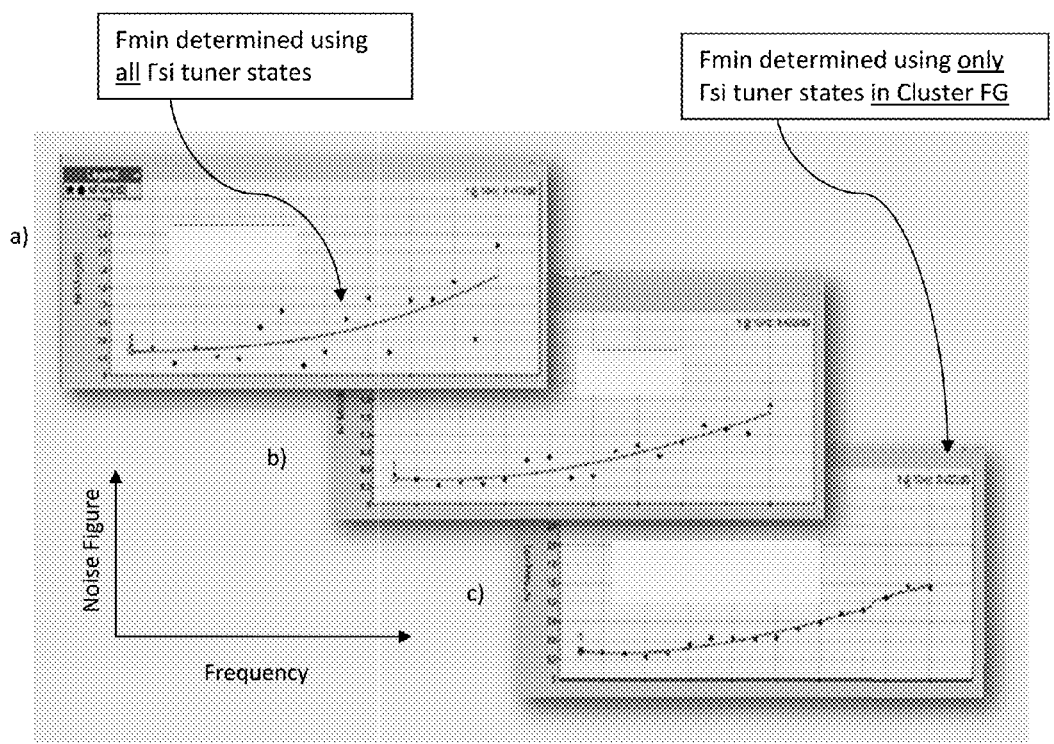
FIG. 3 depicts the evolution of noise parameter sets over frequency, extracted after applying targeted extraction method.

The result of hitherto extractions using the same set of tuner states for extracting all four noise parameters is demonstrated for the case of Fmin in FIG. 3: hereby if measured noise figure data for all tuner states F(Γs.i) are taken into account, the extracted noise parameters are dispersive and therefore potentially less accurate; as shown in FIG. 3, where three sets of actually extracted minimum noise figure (Fmin) values are shown, set (a) uses all tuner states and yields dispersive results, whereas set (c) uses only states in cluster FG for the whole frequency band; the result is smoother and obviously more reliable.

The drawn lines among the data points are mathematical averages. It can be seen that the average itself does not change much when points in FG cluster only are taken, case (c), compared with the case, where all points are considered, case (a); but the confidence in the result increases significantly, since most extracted values match the mathematical average with less dispersion. Similar results are observed for Yopt. The opposite happens in the case of Rn. If only points in FG cluster are used, Rn is dispersive. If also points in RN cluster are included in the calculations then the extracted values of Rn result become more reliable and match better expected values, represented by the mathematical average, similar as in the case of Fmin (FIG. 3).

In summary the invention introduces a new strategy for extraction the four noise parameters from noise figure data, which are fluctuating and associated with random errors. It cannot be assumed that all errors are purely random, since then a simple averaging over a large amount of data would be enough to clean up (average out) such errors. The four noise parameters constitute a noise behavior model of the DUT and as such each model parameter shall be determined where it is most sensitive to the measured inputs. This is made using randomly chosen tuner states in two Smith chart clusters, one around the optimum noise figure and one on the opposite region.

In this invention we disclose a systematic noise parameter extraction method which allows enhanced accuracy also for difficult to measure transistors (those with high S11 and very low optimum noise figure). The selection of distinct source admittance data point clusters for determining different noise parameters over a wide frequency range and the selection of valid points as well as the statistical extraction algorithms are new for this kind of application.

What I claim as my invention is:

1. A method for extracting the four noise parameters of low noise transistors over a broad frequency band uses, at each frequency inside said band, noise figure data F(Γs.i) measured for a multitude of at least 7 source reflection factor points Γs.i, with i≥7, randomly distributed over the source Smith chart;

whereby, at each frequency inside said band, each said noise parameter is extracted using noise figure F(Γs.i) data measured under different sets of source reflection factors as follows:
a) identify the smallest measured noise figure Fo and associated source reflection factor Γs.o;
b) use noise figure data F(Γs.i) measured for reflection factors Γs.i included in a cluster of points with a radius of approximately 0.2 reflection factor units, in proximity and surrounding Γs.o, to extract noise parameters with emphasis on minimum noise figure (Fmin) and optimum source reflection factor Γopt;
c) identify a set of noise figure data points measured for reflection factors Γs.j included in a cluster of points with a radius of approximately 0.1 and being placed approximately anti-diametric to Γopt with respect to the center of the Smith chart;
d) extract noise parameters using data points used in steps a) and c) with emphasis on equivalent noise resistance (Rn);
e) save noise parameter data for Fmin and Γopt extracted in step b) and Rn in step d).

2. A method as in claim 1, whereby a set (cluster FG) of source reflection factors Γs.i is chosen surrounding the said reflection factor Γs.o=|Γs.o|*exp(jφs.o) associated with said smallest measured noise figure Fo; hereby said reflection factors comprise values with amplitudes |Γs.i| both smaller and larger than |Γs.o| and phases φs.i both smaller and larger than φs.o, whereby the radius of said cluster is approximately 0.2 reflection factor units around Γs.o.

3. A method as in claim 1, whereby a set (cluster RN) of source reflection factors Γs.j is chosen surrounding a reflection factor Γs.1 located approximately anti-diametric to Γs.o, whereby Γs.1=|Γs.1|*exp(jφs.1)≈|Γs.o|)*exp(jφs.o+180°; hereby said reflection factors Γs.j comprise values with amplitudes |Γs.j| both smaller and larger than |Γs.1| and phases φs.j both smaller and larger than φs.1, whereby the radius of said cluster is approximately 0.1 reflection factor units around Γs.1.

4. An extraction method for the four noise parameters of the DUT as in claim 1 using Singular Value Decomposition methods.

* * * * *